CONTROLLED BREAKDOWN VOLTAGE DIODE

Filed July 20, 1965

INVENTOR
ALAN F. DIXON
LEOPOLDO B. VALDES
BY [signature]
AGENT 3,417,299
Patented Dec. 17, 1968

3,417,299

CONTROLLED BREAKDOWN VOLTAGE DIODE

Alan F. Dixon, Palo Alto, and Leopoldo B. Valdes, Portola Valley, Calif., assignors to Raytheon Company, Lexington, Mass., a corporation of Delaware Filed July 20, 1965, Ser. No. 473,359
7 Claims. (Cl. 317—234)

ABSTRACT OF THE DISCLOSURE

A controlled breakdown voltage diode comprising a body of semiconductor material having completely enclosed therein a first region of the same conductivity type as said body but having an impurity concentration density in excess of the body, and a second region of opposite conductivity type which is of greater diametric size than said first region and which extends from a surface of the body to said first region and forms with said first region a P-N junction which is completely enclosed within said body and which forms with the remaining portion of the body a second P-N junction which has its edges exposed, whereby transition from said first region to said second region is more abrupt than from said second region to the remainder of the body.

This invention relates to semiconductor diodes and has particular reference to such devices having higher breakdown voltage at the surface than within the bulk of the material from which such devices are formed.

A considerable problem in the design and fabrication of semiconductor diodes, such as avalanche or Zener diodes, is that the breakdown occurs near the surface and is both unstable and generates electrical noise. This problem has been overcome in the presently described device by the provision of a diode wherein the theoretical breakdown voltage at the surface of the diode is considerably higher than the theoretical breakdown voltage within the body of the diode. In the present device, the semiconductor element forming the body of the diode is provided with a first region which has an impurity concentration in excess of the background donor density, for example, at least ten times greater, and a second region of opposite conductivity type overlying the first region and of greater diameter, the second region having a surface impurity concentration which is in excess of that obtained in the first region. Thus, the transition from one conductivity type to the opposite type is much more abrupt below the second region in the area where the second region overlies the first region. With such higher impurity concentrations, it is possible to realize breakdown in the bulk of the diode, providing a diode of greater stability and lower noise.

Accordingly, it is a primary object of this invention to provide an improved semiconductor diode which has higher breakdown voltage at the surface than within the body of material from which the diode is formed.

Other objects and advantages of the invention will become apparent from the following description, taken in connection with the accompanying drawings wherein.

Referring more particularly to the drawings wherein like characters designate like parts throughout the several views, the semiconductor diode illustrated consi ts essentially of a monocrystalline body 10 of semiconductor material such as silicon, gallium arsenide, germanium, or other selected material in the form of a small circular disc or square which may be of any selected size such as, for example, 30 mils in diameter or 30 mils square and 10 mils thick. While these examples of sizes are given herein, it is to be understood that such dimensions may be varied considerably and are not critical.

Body 10 is a high resistivity substrate, preferably of single crystal silicon or epitaxially deposited silicon, which is of N-type conductivity by virtue of having been relatively lightly doped with phosphorous or other selected dopant, such doping being conventional and well known in semiconductor technology and not in itself forming a part of this invention.

Figure 1:
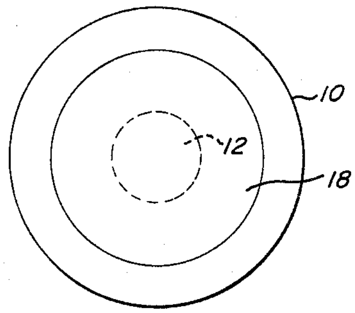
FIG. 1 is a top plan view of a semiconductor diode embodying the invention.
Figure 2:
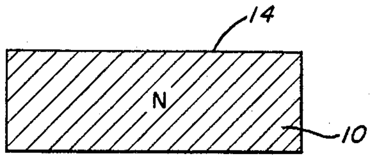
FIG. 2 is a vertical sectional view of a semiconductor element which is to be modified in accordance with this invention.

Into the substrate 10 is diffused a high concentration of an appropriate impurity for the formation of an N+ region 12 as shown in FIG. 2. The impurity, which may be phosphorous, for example, is diffused into and through one surface 14 by any of the well-known diffusion techniques, and is deposited to a depth which extends below an intended junction level indicated by dotted line 16. The actual depth of diffusion is not critical and can be extended to any desired depth below the junction level. The diameter of N+ region 12 is substantially less than the diameter (or width) of the substrate and preferably is about 10 mils. In order to control the diameter of region 12, the diffusion preferably is performed through an opening in a suitable mask which is applied to surface 14 in the well-known manner, such as by vapor depositing an oxide on surface 14 in which windows are cut by photoetching techniques to allow for selective diffusion of the donor material into the body, whereby the N+ region is formed.

An important factor to be considered in connection with the formation of N+ region 12, however, is that the resultant region has an impurity concentration which is considerably in excess of the background donor density, preferably at least ten times greater. For example, the impurity concentration in region 12 should be at least of the order of $5\times10^{14}$ net donor or acceptor atoms per cubic centimeter for silicon.

Figure 3:
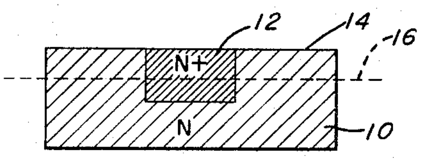
FIG. 3 is a vertical sectional view of the semiconductor element of FIG. 1 as it appears at one stage during the process of manufacture.
Figure 4:
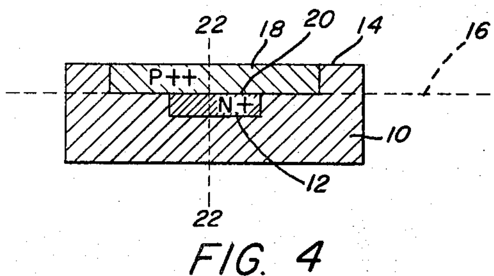
FIG. 4 is a vertical sectional view of the completed semiconductor diode.

After the diffused N+ region 12 is formed to provide the device shown in FIG. 3, a P-N junction is formed within the device by diffusing a selected P-type material into surface 14 to produce a P++ region 18 as shown in FIG. 4. The P-material may be boron, for example, which is diffused by means of conventional diffusing techniques, such as the techniques discussed above, into both the N and N+ regions 10 and 12 so as to provide a region 18 which is of a diameter greater than region 12, preferably being 15 mils in diameter. Thus, region 18 overlies not only the upper portion of region 12 but also the adjacent portions of region 10. It is important, in accordance with this invention, that the resultant region 18 has an impurity concentration which is considerably in excess of the impurity concentration in region 12, preferably at least ten times greater. For example, the impurity concentration in region 18 should be at least of the order of $10^{17}$ net donor or acceptor atoms per cubic centimeter.

Region 18 is formed to a depth concident with the desired P-N junction level 16, and, thus, there is formed a P-N junction 20 in the areas where the P++ region 18 abuts the N and N+ regions 10 and 12. It will be apparent, however, that the transition from P to N is much more abrupt in the area where region 18 joins region 12 than in the areas where region 18 joins region 10. This is because the N-type impurity density of region 12 is much greater than the background donor density of region 10. Since the surface breakdown voltage is determined by the background density at the periphery of surface 14 where the P-N junction 20 is exposed, it will be apparent that there has been achieved a lower breakdown voltage in the bulk of the material (at the junction between regions 12 and 18) than at the surface.

Figure 5:
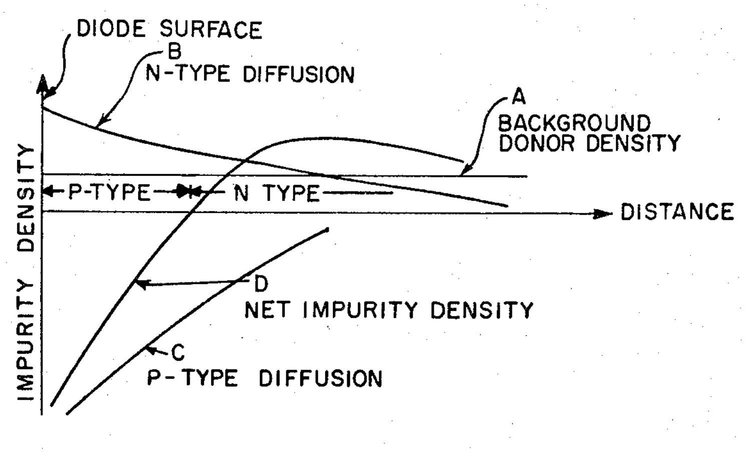
FIG. 5 is a diagram of the impurity concentration from the top of the wafer through the center of a completed device.

This last point is illustrated in FIG. 5 wherein there is shown a profile of impurity density versus distance away from the surface along vertical plane 22—22 in the device of FIG. 4. While we have been talking about the impurity concentrations in the various regions, it is obvious that the diffusion process provides graded impurity distributions, as is indicated in FIG. 5 wherein line A shows the impurity density in the original wafer, line B shows the impurity density from the first diffusion, line C shows the impurity density from the second diffusion, and line D shows the sum of all impurities (subtracting donors from acceptors) and gives the final net impurity concentration in the finished device. The junction occurs where the net impurity changes from P-type to N-type.

Although the invention has been described with particular reference to semiconductor bodies of silicon which are of N-type conductivity, it will be understood that it may be practiced also with bodies of other materials and may be of opposite conductivity type. For example, the body 10 may be of P-type, the region 12 may be P+-conductivity type, and region 18 may be N++-conductivity type, with region 12 having P-type acceptor impurity density substantially greater than the background acceptor density, and region 18 having a donor impurity density greater than the impurity density of region 12. This will also provide a device wherein the breakdown voltage within the body of the device will be lower than at the surface.

From the foregoing, it will be apparent that a novel semiconductor device has been provided in accordance with the objects of this invention. However, it is apparent that changes and modifications in the described embodiment of the invention and in the method of its manufacture may be made by those skilled in the art without departing from the spirit of the invention as expressed in the accompanying claims. Accordingly, all matter shown and described should be interpreted as illustrative and not in a limiting sense.

We claim:

1. A semiconductor diode having higher breakdown voltage at its surface than within its bulk, comprising:
   a body of semiconductor material having a main portion doped with a selected concentration of selected impurity which provides a predetermined conductivity type, said body having first and second opposed broad surfaces, and a P-N junction level between and parallel with said surfaces,
   a first region of the same conductivity type within the body and having an impurity concentration density in excess of the density of the impurity concentration in the main portion of the body, said first region being of restricted diametric size and extending within the body from said P-N junction level to a level spaced from said first surface,
   and a second region of opposite conductivity type within the body and having an impurity concentration density which is in excess of the impurity concentration density of said first region, said second region overlying said first region and being of greater diametric size than said first region and extending from said second surface of the body to said P-N junction level, said first region being completely enclosed within said body and having with said second region a P-N junction at said level which is completely enclosed within said body whereby transition from the second region to the first region occurs entirely within the body and is more abrupt than from the second region to the remainder of the body.

2. A semiconductor diode substantially as set forth in claim 1, wherein said body and said first region are of N-type conductivity and said second region is of P-type conductivity.

3. A semiconductor diode substantially as set forth in claim 1, wherein said body is of N-type conductivity, said first region is of N+ type conductivity, and said second region is of P++ type conductivity.

4. A semiconductor diode substantially as set forth in claim 1, wherein said body is a high resistivity substrate of single crystal silicon.

5. A semiconductor diode substantially as set forth in claim 1, wherein said body is a high resistivity epitaxially formed substrate.

6. A semiconductor diode substantially as set forth in claim 1, wherein the impurity concentration density in said second region is at least ten times greater than the impurity concentration density in said body.

7. A semiconductor diode substantially as set forth in claim 1, wherein the impurity concentration in said first region is at least of the order of $5 \times 10^{14}$ atoms per cubic centimeter, in said second region is at least of the order of $10^{17}$ atoms per cubic centimeter, and in the remainder of said body is at least ten times less than in said first region.

References Cited

UNITED STATES PATENTS 3,099,591 7/1963 Shockley ------------ 148—33
3,248,614 4/1966 Rutz -------------- 317—234

JOHN W. HUCKERT, *Primary Examiner.*

R. F. SANDLER, *Assistant Examiner.*